US006433712B1

(12) United States Patent
Ohnhaeuser et al.

(10) Patent No.: US 6,433,712 B1
(45) Date of Patent: Aug. 13, 2002

(54) OFFSET ERROR COMPENSATION OF INPUT SIGNALS IN ANALOG-TO-DIGITAL CONVERTER

(75) Inventors: Frank Ohnhaeuser, Bavaria (DE); Miroslav Oljaca, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/912,992

(22) Filed: Jul. 25, 2001

(51) Int. Cl.[7] .............................................. H03M 1/12
(52) U.S. Cl. ...................................... 341/118; 341/155
(58) Field of Search ................................ 341/118, 155, 341/119, 120, 121

(56) References Cited

U.S. PATENT DOCUMENTS 5,523,756 A * 6/1996 Mariuz ........................ 341/118
6,351,227 B1 * 2/2002 Rudberg ...................... 341/118

* cited by examiner

Primary Examiner—Brian Young
(74) Attorney, Agent, or Firm—W. Daniel Swayze, Jr.; W. James Brady; Frederick J. Telecky, Jr.

(57) ABSTRACT

An analog-to-digital converter receiving an analog input signal ($V_{IN}$) including an offset component, and includes a switched capacitor input circuit (101) configured to sample the analog input signal ($V_{IN}$) to produce and store a signal representative of the sampled input signal between a first conductor (17) and a second conductor (27). A conversion circuit (1) is coupled to the first conductor (27) and the switched capacitor input circuit (101) to produce a digital output signal (DATA OUT). An offset correction circuit (4) includes an output coupled to the second conductor (27) and an input receiving a digital offset correction signal (DATA IN), the offset correction circuit (4) including a switched capacitor correction circuit (4A) operative in response to the offset correction control signal (DATA IN) to transfer charge to/from the second conductor (27). The conversion circuit (1) operates in response to adjustment by the offset correction circuit (4) of a signal conducted by the second conductor (27) to produce the digital output signal (DATA OUT) compensated for the offset component.

25 Claims, 4 Drawing Sheets

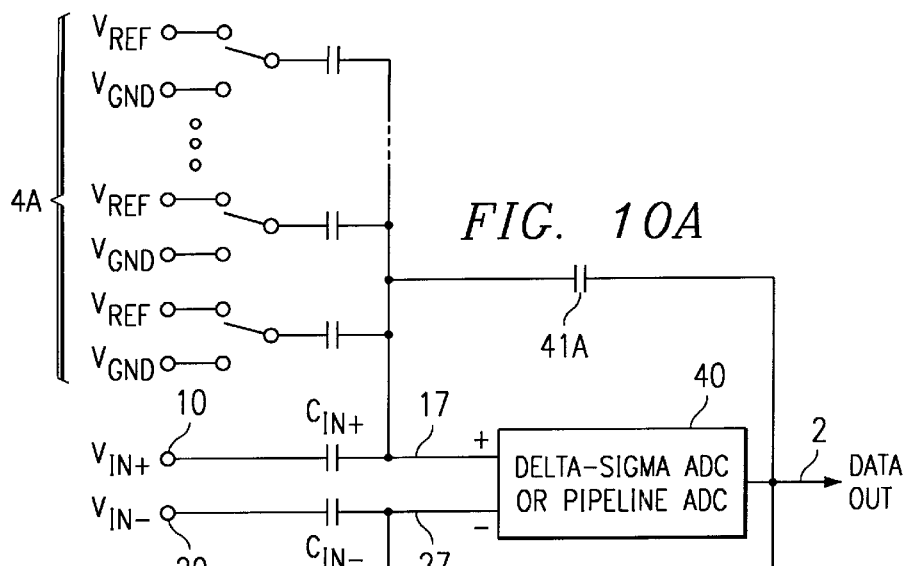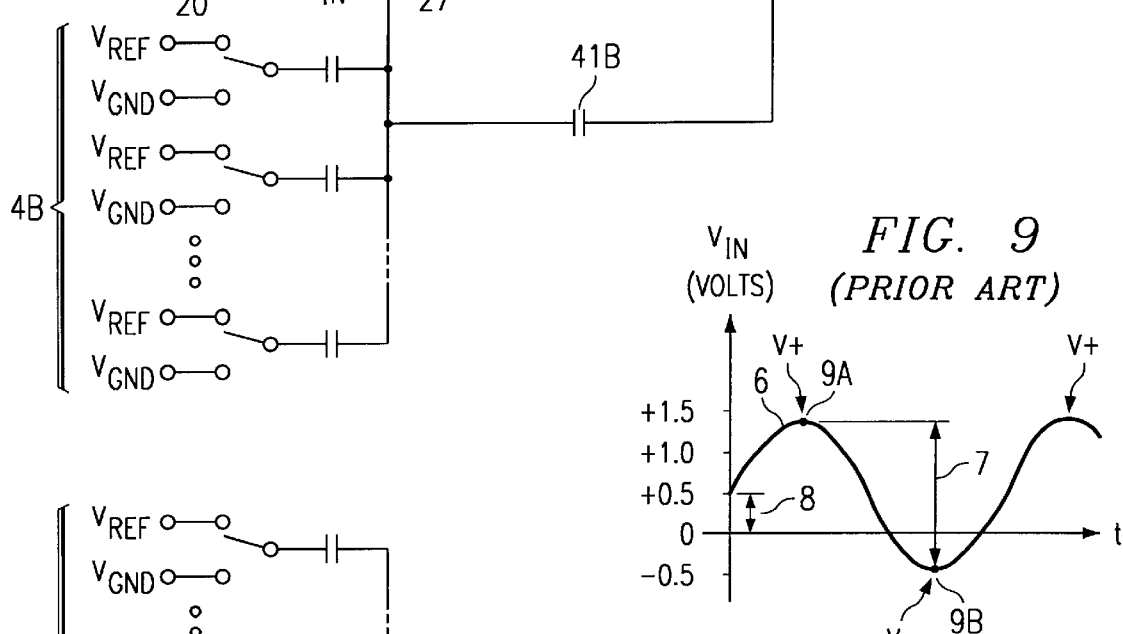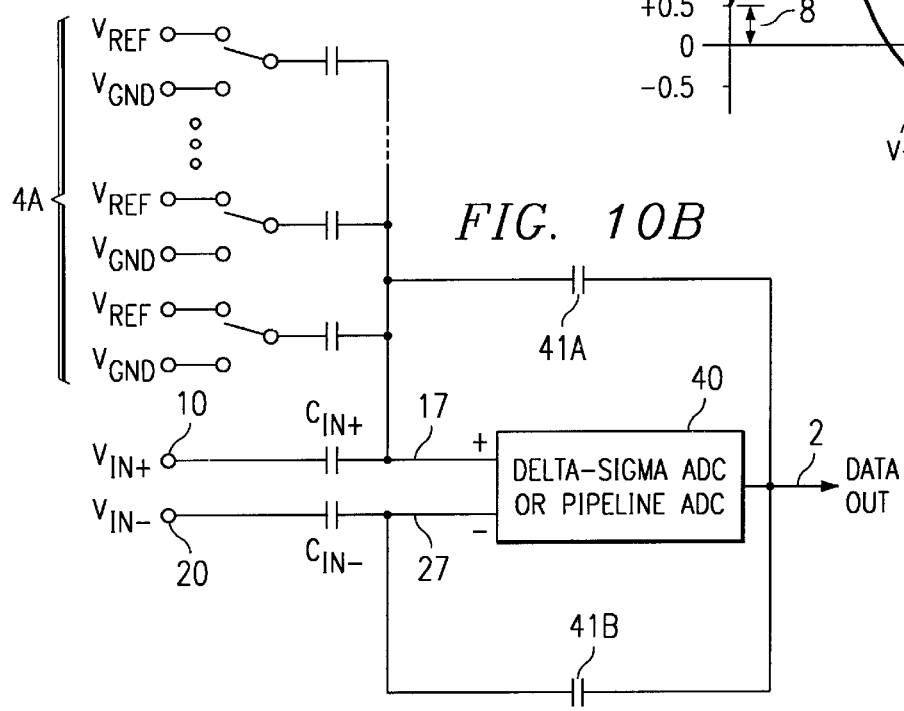

OFFSET ERROR COMPENSATION OF INPUT SIGNALS IN ANALOG-TO-DIGITAL CONVERTER

BACKGROUND OF THE INVENTION

The invention relates to a method and circuit for compensating an offset component of an input signal (also referred to as a measurement signal) applied to an input of an analog-to-digital converter (ADC). The invention also relates to a method and circuit for compensating an offset component of an input signal applied to an input of a successive approximation register (SAR) ADC, or to compensating an offset component of an input signal applied to an input of any other type of switched capacitor ADC, such as a delta-sigma ADC, pipeline ADC, etc.

In most cases, an analog input signal applied to the input of an ADC is a non-ideal signal. Typically, such an analog input signal includes an offset component that occurs as a result of non-ideal behavior of a sensor, transducer, or other interface circuit generating the analog signal. For example, an analog signal produced by a bridge circuit, Hall effect sensor or the like, or an analog encoder, is likely to have a substantial offset voltage. The polarity of the offset voltage applied to the input of analog digital converter may not be certain.

The offset component of the analog signal can be caused by temperature drift of the sensor or transducer. Or, the offset component of the analog signal can be caused by a front-end buffer amplifier producing the analog signal in response to the signal produced by a sensor or other circuit. The construction of a sensor itself can be a source of the offset component of the analog input signal applied to the input of the ADC. For example, an analog signal produced by a magnetic sensor may include an offset component caused by magnetization of the magnetic circuit. Even though modern design of various sensors and associated front-end electronics (such as buffer amplifiers) tends to minimize the magnitude of the offset component of the measurement signal, the offset component nevertheless often is sufficiently large to be problematic, for example, by masking or obstructing useful signal information contained in the measurement signal.

Consequently, numerous software techniques and hardware techniques have been developed to extract useful signal information from the measurement signal. Typical hardware techniques include compensating the offset component error to provide a "clean" analog signal to the input of the ADC, but this solution to the problem may not be cost-effective because of the cost of additional circuit components. Software solutions of the problems caused by offset components generally require more computing time by a digital signal processor (DSP) or microcontroller or the like (e.g., to measure the value of a positive peak (such as $V^+$ in FIG. 9) and the value of a negative peak (such as $V^-$ in FIG. 9) of the measurement signal and divide the sum thereof by 2 to obtain the offset value $(V^+ + V^-)/2$, or to measure a "steady-state" value of the measurement signal which is equal to the offset value). The delay may be unacceptable in time-critical applications.

The waveform of "prior art" FIG. 9 includes an "ideal" offset sinusoidal signal 6 having an amplitude of 1.5 volts, a peak-to-peak value 7 of 2 volts, and a positive offset of 0.5 volts. The 0.5 voltage offset causes the maximum value at point 9A of the waveform to be +1.5 volts and the minimum value at point 9B to be −0.5 volts.

Referring to FIG. 9, it should be understood that, to convert the offset sinusoidal signal 6 to a digital representation, a differential ADC which ordinarily would be needed to measure the 2 volt peak-to-peak value of the offset input signal 6 would require a 3 volt input range (−1.5 volts to plus 1.5 volts). The full-scale digital output signal produced by the ADC to represent the 2 volt peak-to-peak offset input signal 6 actually would be capable of representing a 3 volt peak-to-peak input signal having zero offset. Thus, the effective resolution of the analog-to-digital conversion of an offset analog input signal is inherently less than the effective resolution of an input signal of the same amplitude but having no offset.

SUMMARY OF THE INVENTION

Accordingly, it is an object of the invention to provide an ADC capable of automatically compensating a high range of offset component errors in an analog input signal applied to the input of the ADC without requiring use of additional circuit components and without causing substantial delay in computing/determining an accurate digital output that accurately represents the true signal information contained in the analog input signal.

It is another object of the invention to avoid the loss of resolution that ordinarily occurs as a result of analog-to-digital conversion of an input signal having a substantial offset component.

Is another object of the invention to reduce or eliminate the software overhead required for extracting useful information from a measurement signal.

Briefly described, and in accordance with one embodiment thereof, the invention provides an analog-to-digital converter receiving an analog input signal ($V_{In}$) including an offset component. The analog-to-digital converter includes a switched capacitor input circuit (101) configured to sample the analog input signal ($V_{IN+}$) to produce and store a signal representative of the sampled input signal on the first conductor (17). A conversion circuit (1) is coupled to the first conductor (17) and the switched capacitor input circuit (101), and is configured to produce a digital output signal (DATA OUT) representative of the analog input signal ($V_{IN}$). An offset correction circuit (4) includes an output coupled to the a second conductor (27), and also includes an input receiving a digital offset correction signal (DATA IN). The offset correction circuit (4) includes a switched capacitor correction circuit (4A) operative in response to the offset correction control signal (DATA IN) to transfer charge to or from the first conductor (17). The portion of the conversion circuit (1) connected to the first conductor (17) operates in response to adjustment by the offset correction circuit (4) of a signal conducted by the second conductor (27) so as to produce the digital output signal (DATA OUT) compensated for the offset component.

BRIEF DESCRIPTION OF THE DRAWINGS

FIG. 9 is a waveform of a typical analog input signal having an offset component.

FIG. 10A is a block diagram illustrating an embodiment of the invention including an ADC other than a SAR type of ADC.

FIG. 10B is a block diagram of a variation of the embodiment of FIG. 2A.

DETAILED DESCRIPTION OF THE PREFERRED EMBODIMENTS

Figure 1:
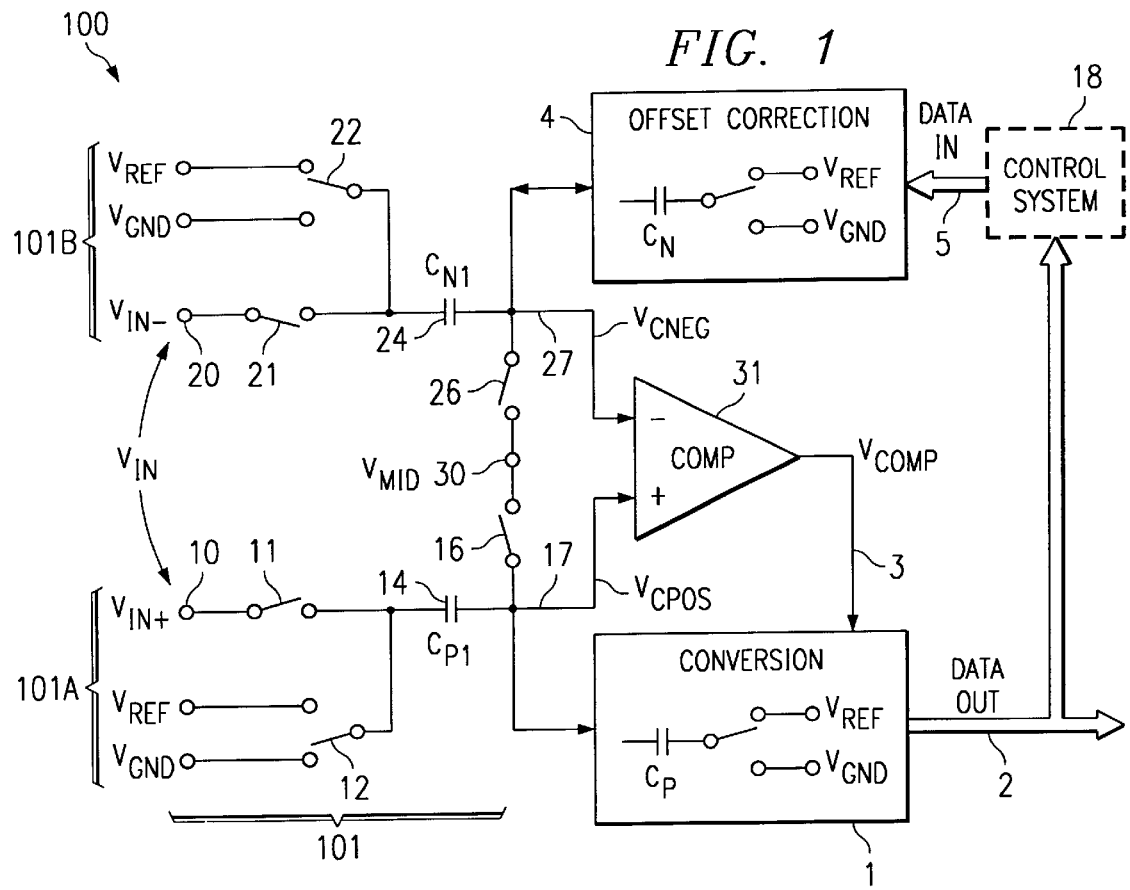
FIG. 1 is a partial schematic diagram illustrating the automatic input signal offset correction system of the present invention.

Referring to FIG. 1, successive approximation analog-to digital converter 100, hereinafter referred to simply as ADC 100, includes an input stage 101 which receives a differential input signal $V_{IN}$ that is equal to the difference between a "positive" input signal $V_{IN+}$ applied to input conductor 10 and a "negative" input signal $V_{IN-}$ applied to input conductor 20. Input stage 101 includes a "positive" section 101A that receives $V_{IN+}$ and, in response thereto, produces the signal $V_{CPOS}$ on conductor 17, which is connected to the (+) input of a comparator 31. Input stage 101 also includes a "negative" section 101B that receives $V_{IN-}$ on conductor 20 and, in response thereto, produces the signal $V_{CNEG}$ on conductor 27, which is connected to the (−) input of comparator 31. Comparator 31 produces an output signal $V_{COMP}$ on conductor 3.

Conductor 17 also is connected to an input of a conventional SAR (successive approximation register) circuit 1, which determines successive bits of the digital output DATA OUT by successively testing individual parallel, binarily weighted capacitors collectively represented by $C_P$ to determine if the charge stored thereon causes comparator 31 to produce a "1" or a "0" of the signal $V_{COMP}$ on the comparator output conductor 3 so as to test the corresponding bit of DATA OUT according to the conventional successive approximation analog-to-digital conversion technique. SAR conversion circuit 1 sequentially produces the N-bit digital output signal DATA OUT on bus 2 in response to the testing of the individual binarily weighted capacitors represented by $C_P$.

Positive section 101A of input stage 100 includes an input switch 11 connected between input conductor 10 and the left terminal of capacitor 14, which has a capacitance C and also is referred to as capacitor $C_{P1}$. The left terminal of capacitor $C_{P1}$ also is connected to one terminal of a switch 12, which selectively connects the left terminal of capacitor $C_{P1}$ to either $V_{REF}$ or $V_{GND}$. The right terminal of capacitor $C_{P1}$ is connected to conductor 17, which is also connected to one terminal of a switch 16 and to the (+) input of comparator 31 and to SAR network 1.

Negative section 101B includes a switch 21 connected between input conductor 20 and the left terminal of a capacitor 24, which has a capacitance C and also is referred to as capacitor $C_{N1}$. The left terminal of capacitor $C_{N1}$ also is connected to one terminal of a switch 22, which is selectively connected to either $V_{REF}$ or $V_{GND}$. The right terminal of capacitor $C_{N1}$ is connected to conductor 27, which is also connected to one terminal of a switch 26 and to the (−) input of comparator 31 and to offset correction network 4. The other terminal of each of switches 16 and 26 is connected to conductor 20, the voltage of which is $V_{MID}$.

Conductor 27 also is connected to an offset correction circuit 4 that, in accordance with the present invention, automatically corrects or compensates an offset component that may be included in the input signal $V_{IN}$. Block 18 in FIG. 1 represents an external (although it could be internal) control circuit/system that is connected to bus 2 to receive DATA OUT. The control system 18, which can be readily implemented by means of a microprocessor or a digital signal processor (DSP), can operate in a first mode to cause analog-to-digital converter 100 to measure and store the maximum and minimum values (such as $V^+$ and $V^-$ in FIG. 9) of the input signal $V_{IN}$ and computes the peak-to-peak value of $V_{IN}$ and the magnitude and polarity of the offset component of $V_{IN}$, and then accordingly produces a value of the digital compensation signal DATA IN, which is needed to compute the offset component of $V_{IN}$.

Also, control system 18 can operate in a second mode to cause analog-to-digital converter 100 to measure a steady-state value of an analog input signal $V_{IN}$ (i.e., the common mode voltage), which by definition is equal to the offset component of $V_{IN}$. It should be appreciated that some transducers are capable of producing a steady-state signal equal to the offset component signal thereof, and that some other transducers are not capable of producing a steady-state signal upon which an AC component representing a quantity measured by the transducer is superimposed. The analog-to-digital conversion system shown in FIG. 1 is capable of compensating for the offset component of either kind of analog input signal.

An offset correction circuit 4 includes a group of parallel-connected, binarily weighted capacitors represented by $C_N$, each of which is selectively connected to either $V_{REF}$ or $V_{GND}$ according to the value of DATA IN, so as to automatically compensate (i.e., effectively cancel) the offset component of $V_{IN}$, so that the digital output signal DATA OUT has a full-scale value equal to the magnitude of the analog input signal $V_{IN}$ plus or minus the magnitude of the offset component thereof (because the polarity of the offset component can be positive or negative). During sampling of $V_{IN}$, the binarily weighted capacitors $C_{N22}, C_{N21} \ldots C_{N2J}$ are referenced to ground.

Figure 2:
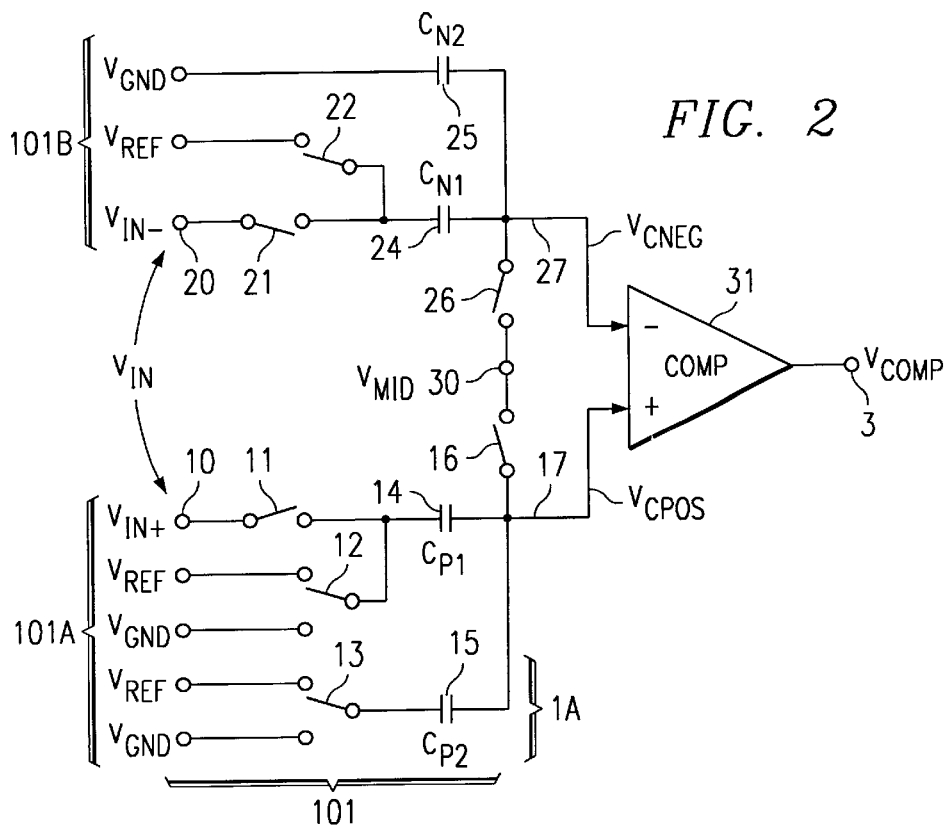
FIG. 2 what is a schematic diagram of an input stage of a SAR ADC without offset compensation.

FIG. 2 shows input stage 101 of the SAR ADC 100 in slightly more detail than FIG. 1. In FIG. 2, a capacitor 25, which has a capacitance C and is also referred to as capacitor $C_{N2}$, is connected between conductor 27 and $V_{GND}$. Similarly, a capacitor 15, which has a capacitance C and is also referred to as capacitor $C_{P2}$, is connected between conductor 17 and one terminal of single pole, double throw switch 13, the single pole of which is selectively connected to either $V_{REF}$ or $V_{GND}$. As subsequently explained, capacitor $C_{P2}$ and switch 13 in FIG. 2 represent a group of binarily weighted capacitors and associated switches included in a portion 1A of SAR conversion circuit 1 in FIG. 1.

Still referring to FIG. 2, switches 16 and 26 are closed to prepare for sampling of the measured input signal $V_{IN}$. This causes the (−) and (+) inputs of comparator 31 both to be equal to the mid-point voltage $V_{MID}$. The next step to prepare for of sampling the measured input voltage $V_{IN}$ involves closing the switches represented by reference switch 13 to connect one plate of each of the capacitors represented by $C_{P2}$ to the ground voltage $V_{GND}$. Then, the ADC is ready for the actual sampling of the measured input signal $V_{IN}$, which is initiated by closing input switches 11 and 21, with switches 12 and 22 remaining open.

Figure 3:
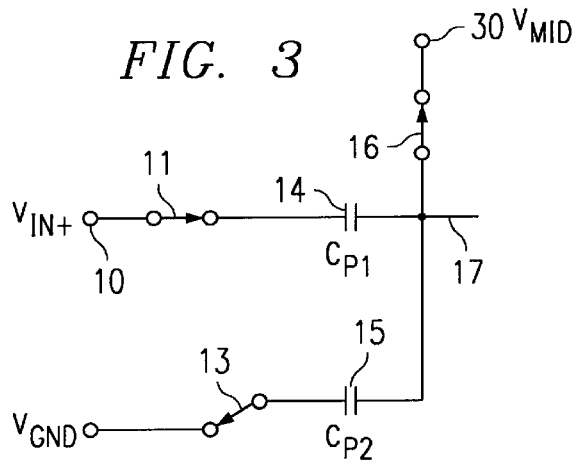
FIG. 3 is a schematic diagram of equivalent circuitry useful in explaining charging of capacitors $C_{P1}$ and $C_{P2}$ during the input sampling portion of the operation of the ADC of FIG. 1.

After an initial transition period of the input sampling process, the voltages on conductors 17 and 27 become stabilized, providing a circuit configuration that is schematically represented by FIG. 3 (only for conductor 17), which shows the circuit configuration for charging capacitors $C_{P1}$ and $C_{P2}$ during the input sampling process FIG. 3 shows switch 11 closed, connecting $V_{In+}$ to the left terminal of capacitor $C_{P1}$. Switch 13 connects the left terminal of capacitor $C_{P2}$ to $V_{GND}$. Switch 16 is closed, connecting conductor 17 to $V_{MID}$ and conductor 27. This results in the charging of capacitors $C_{P1}$ and $C_{P2}$, which is represented by Equation 1, shown below. A similar circuit configuration, not shown, can be drawn to represent the charging of capacitors $C_{N1}$ and $C_{N2}$, which is represented by Equation 2, also shown below.

$$Q_{PS} = (V_{MID} - V_{IN+}) \times C_{P1} + (V_{MID} - V_{GND}) \times C_{P2} \quad \text{(Eq. 1)}$$

$$Q_{NS} = (V_{MID} - V_{IN-}) \times C_{N1} + (V_{MID} - V_{GND}) \times C_{N2} \quad \text{(Eq. 2)}$$

After the charging processes of Equations 1 and 2 are completed, the next step in the analog-to-digital conversion process is to open switches 16 and 26 so that the (+) and (−) inputs are no longer connected together. This "freezes" the charge $Q_{PS}$ on capacitors $C_{P1}$ and $C_{P2}$, and also freezes the charge $Q_{NS}$ on capacitors $C_{N1}$ and $CN_{N2}$. Input switches 11 and 21 then are opened. Next to, to begin the comparing process, switches 12 and 22 are operated to connect the left plates of capacitors $C_{N1}$ and $C_{P1}$ to $V_{REF}$. The charging of capacitors $C_{P1}$ and $C_{P2}$ is the same during the sampling operation and the conversion operation. Note that $V_{CPOS}$ is defined as the voltage on conductor 17, applied to the (+) input of comparator 31, and $V_{CNEG}$ is the voltage on conductor 27, applied to the (−) input of comparator 31.

Figure 4:
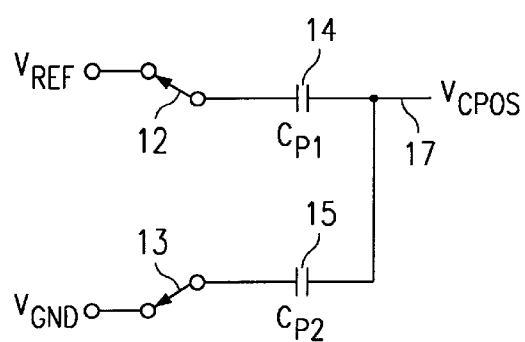
FIG. 4 is a schematic diagram of circuitry useful in explaining charging of capacitors $C_{P1}$ and $C_{P2}$ during the conversion portion of the operation of the ADC of FIG. 1.

FIG. 4 shows an equivalent circuit which illustrates the above mentioned process of switching capacitors $C_{P1}$ and $CP_2$, which is defined by Equation 3, shown below. FIG. 4 shows switch 12 connecting the left terminal of capacitor $C_{P1}$ to $V_{REF}$, and also shows switch 13 connecting the left terminal of capacitor $CP_2$ to $V_{GND}$. A similar equivalent circuit (not shown) can be drawn to illustrate the process of charging capacitors $C_{N1}$ and $CN_2$, which is defined by Equation 4, also shown below.

$$Q_{PC1} = (V_{CPOS} - V_{REF}) \times C_{P1} + (V_{CPOS} - V_{GND}) \times C_{P2} \quad \text{(Eq. 3)}$$

$$Q_{NC1} = (V_{CNEG} - V_{REF}) \times C_{N1} + (V_{CNEG} - V_{GND}) \times C_{N2} \quad \text{(Eq. 4)}$$

The charging of capacitor $C_{P1}$ and capacitor $CP_2$ during the sampling operation is the same as during the conversion operation, because charge from conductor 17 cannot go anywhere else. Combining Equation 1 and Equation 3, and setting $V_{GND}$ equal to 0 results in Equation 5, shown below:

$$V_{CPOS} = V_{MID} + \frac{C_{P1}}{C_{P1} + C_{P2}} \times (V_{REF} - V_{IN+}). \quad \text{(Eq. 5)}$$

A similar procedure applies to the negative side 101B of the input stage 101, wherein the charging of capacitors $C_{N1}$ and $C_{N2}$ is the same during the sampling operation and the conversion operation, so combining Equation 2 and Equation 4 and setting $V_{GND}$ equal to 0 results in Equation 6, shown below:

$$V_{CNEG} = V_{MID} + \frac{C_{N1}}{C_{N1} + C_{N2}} \times (V_{REF} - V_{IN-}). \quad \text{(Eq. 6)}$$

Thus, Equations 5 and 6 determine the voltages $V_{CPOS}$ and $V_{CNEG}$ applied to the (+) and (−) inputs, respectively, of comparator 31 as a function of the input voltages $V_{IN+}$ and $V_{IN-}$. Typically, capacitors $C_{N1}$ and $C_{N2}$ are of the same capacitance C as capacitors $C_{P1}$ and $C_{P2}$. The voltage $V_{CNEG}$ determined according to Equation 6 is constant during the entire conversion, and can be described by Equation 7, shown below:

$$V_{CNEG} = V_{MID} + \frac{V_{REF} - V_{IN-}}{2}. \quad \text{(Eq. 7)}$$

Figure 5:
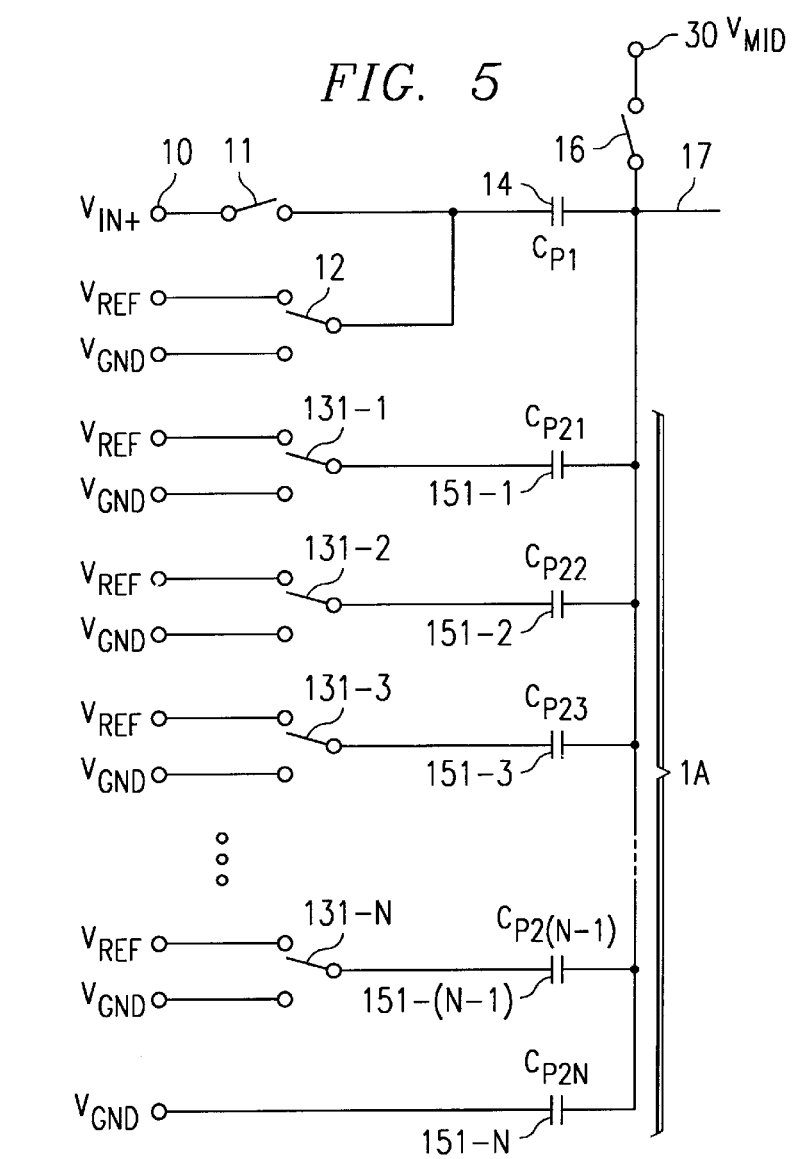
FIG. 5 is a schematic diagram similar to FIG. 2, and is useful in explaining the conversion process of the operation of a SAR ADC.

At this point, it should be understood that in FIGS. 2, 3 and 4, $C_{P2}$ represents a parallel connection of capacitors $C_{P21}, C_{P22} \ldots C_{PN}$, where N is the resolution of the ADC. (For example, for a 10-bit ADC, N is equal to 10.) Ordinarily, the capacitances of $C_{P1}$ and $C_{P2}$ have the same value C. In that case, the capacitors $C_{P21}, C_{P22} \ldots C_{PN}$ have the capacitance values of $C/2^0, C/2^1 \ldots C/2^N$, and their sum will be equal to C. This is illustrated in FIG. 5, wherein the capacitor $C_{P2}$ represented by reference character 1A is represented by N capacitors $C_{P2}, C_{P21} \ldots C_{PN}$, each having its right terminal connected to conductor 17 and its left terminal connected by a corresponding switch 151-1,2 . . . N to either $V_{REF}$ or $V_{GND}$ (in response to the results of the previous comparison by comparator 31 and the conventional control circuitry in block 1 of FIG. 1).

Figure 6:
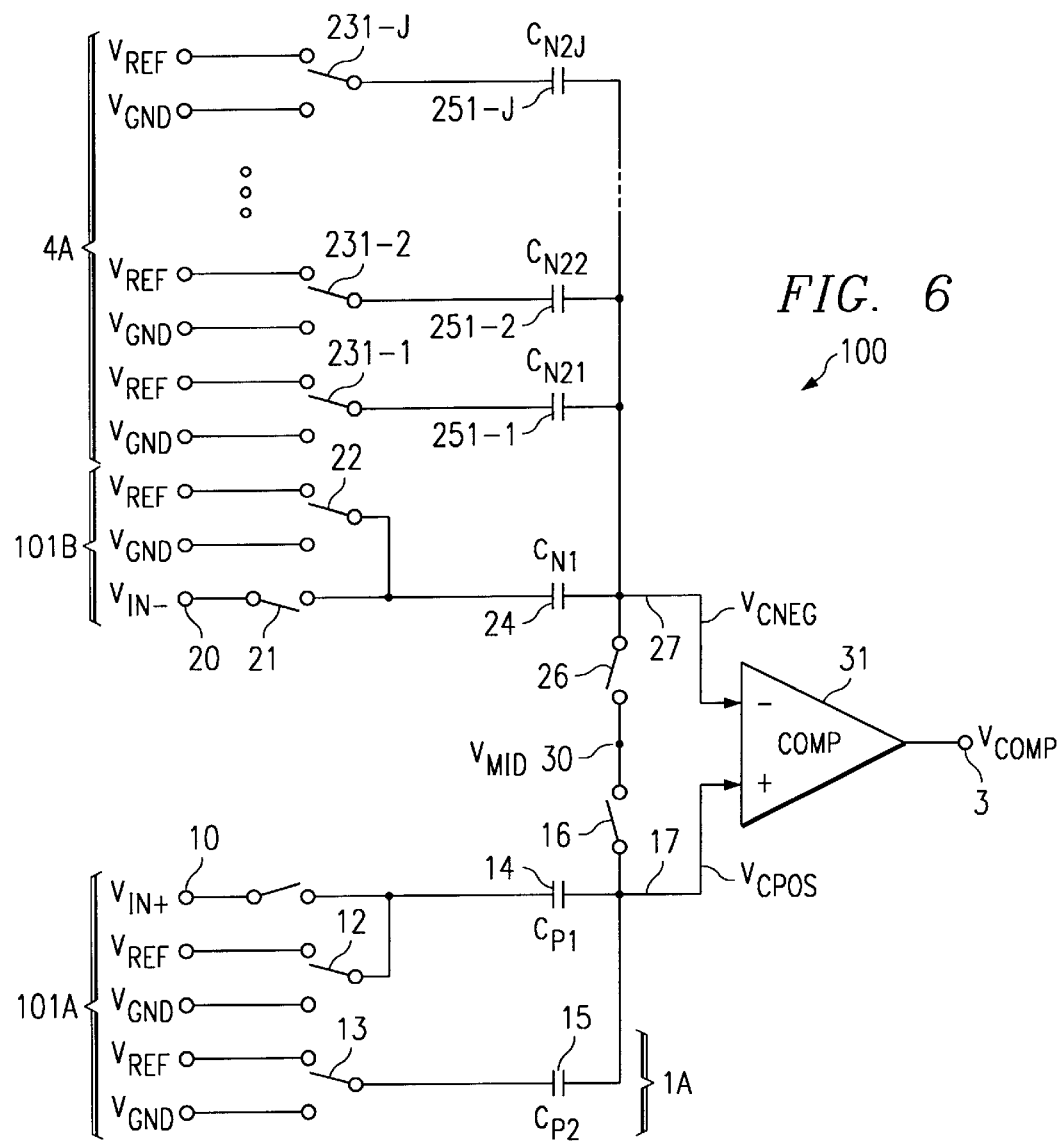
FIG. 6 is a schematic diagram illustrating the circuitry included in the input stage of the ADC of FIG. 1 for compensating offset in the input signal.

It should be noted that the described embodiment of the invention automatically offsets the negative voltage $V_{CNEG}$ during, rather than before or after, the analog-to-digital conversion, so that offset error components of the input signals $V_{IN+}$ and $V_{IN-}$ are, in effect, automatically removed during the conversion. To accomplish automatic compensation or cancellation of the offset error of the input signal during the conversion, capacitor $CN_2$ in FIG. 2 is replaced in FIG. 6 by capacitors $C_{N21}, C_{N22} \ldots C_{N2J}$, where J is the number of bits required to achieve the desired precision of the compensation. As shown in FIG. 6, additional switches 231-1, 231-2 . . . 231-J are connected to the left terminals of capacitors $CN_{N21}, CN_{22} \ldots C_{N2J}$, respectively, to allow them each to be selectively connected to $V_{REF}$ or $V_{GND}$ in response to the digital offset compensation control signal DATA IN. In FIG. 6, a portion of the circuitry included in offset correction circuit 4 of FIG. 1 is included and is designated by reference numeral 4A. Offset correction circuitry 4A includes the J capacitors $C_{N21}, C_{N22} \ldots C_{N2J}$ each having its right terminal connected to conductor 27.

Still referring to FIG. 6, preparation for sampling of the input signal $V_{IN-}$ begins by closing switch 26, which causes the voltage $V_{CNEG}$ applied to the (−) of comparator 31 to be equal to $V_{MID}$ Then switches 231-1,2 . . . J are operated to connect the left plates of capacitors $C_{N21}, C_{N22} \ldots C_{N2J}$ to $V_{REF}$ or $V_{GND}$ according to the value of DATA IN (only after sampling, because at the beginning of the sampling of $V_{IN}$, all of the switches 231-1,2 . . . J are closed due to $V_{GND}$), and switch 22 remains open. The actual sampling of $V_{IN-}$ then begins by closing input switch 21. The above described connecting of the left plates of the capacitors $C_{N21}$, $C_{N22}$ . . . $C_{N2J}$ to $V_{GND}$ during sampling and to $V_{REF}$ or $V_{GND}$ according to DATA IN during conversion produces an offset of one polarity or direction. To obtain an offset of the other polarity or direction, it is necessary to connect the left plates of the capacitors $C_{N21}$, $C_{N22}$ . . . $C_{N2J}$ to $V_{REF}$ or $V_{GND}$ during sampling according to DATA IN and to $V_{GND}$ during the conversion.

Figure 7:
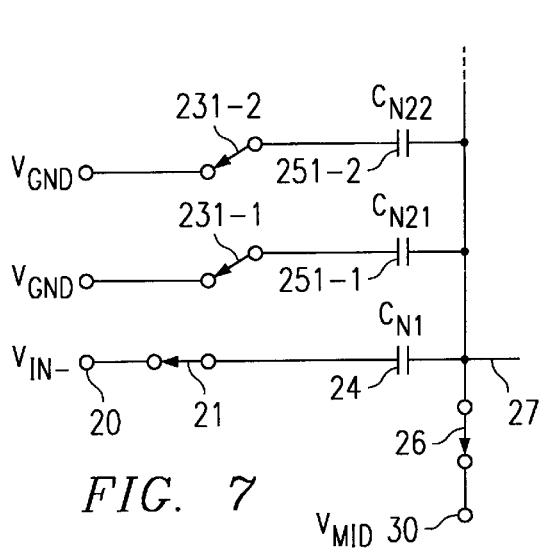
FIG. 7 is a schematic diagram of an equivalent circuit useful in explaining the charging of certain capacitors in the input stage of the ADC of FIGS. 1 and 6 during the input sampling and offset compensation portion of the operation of the ADC.

FIG. 7 shows an equivalent circuit which the represents the resulting charging of capacitor $C_{N1}$ and capacitors $C_{N21}$, $C_{N22}$ . . . $C_{N2J}$ although for convenience, only the first two of capacitors $C_{N21}$, $C_{N22}$ . . . $C_{N2J}$ (namely $C_{N21}$ and $C_{N22}$) are shown. The equivalent circuit of FIG. 7 shows switch 21 closed to connect the left terminal of capacitor $C_{N1}$ to $V_{IN-}$, and also shows switch 26 closed to connect conductor 27 to $V_{MID}$. Switch 231-1 connects the left terminal of capacitor $C_{N21}$ to $V_{GND}$. Switch 231-2 connects the left terminal of capacitor $C_{N22}$ to $V_{GND}$. The charging of capacitor $C_{N2}$ and the first two of the capacitors $C_{N21}$, $C_{N22}$ . . . $C_{N2J}$ (namely, capacitors $C_{N21}$, and $C_{N22}$) is represented by Equation 8, shown below:

$$Q_{NS}=(V_{MID}-V_{IN-})\times C_{N1}+(V_{MID}-V_{GND})\times(C_{N21}+C_{N22}) \quad \text{(Eq. 8)}$$

Figure 8:
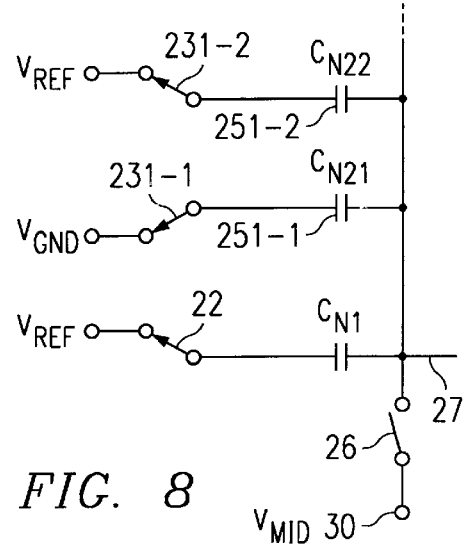
FIG. 8 is a schematic diagram of another equivalent circuit useful in explaining the charging of certain capacitors in the input stage of the ADC of FIGS. 1 and 6 during the conversion and offset compensation portion of the operation of the ADC.

The next step in the analog-to-digital conversion and offset cancellation process includes opening switch 26 so that the negative voltage $V_{CNEG}$ applied by conductor 27 to the (−) input of comparator 31 is no longer connected to $V_{MID}$ and the charge $Q_{NS}$ is frozen on capacitors $C_{N21}$, $C_{N22}$ . . . $C_{N2J}$. Then input switch 21 is opened. To begin the comparison process by comparator 31, switch 22 is operated, for example, to connect the left plates of capacitor $C_{N1}$ to $V_{REF}$ and switch 231-2 switches the left terminal of capacitor $C_{N22}$ from $V_{GND}$ to $V_{REF}$ the present value of the DATA IN signal for this example. This results in the circuit structure illustrated in the equivalent circuit shown in FIG. 8. The equivalent circuit of FIG. 8 shows switch 22 closed to connect the left terminal of capacitor $C_{N1}$ to $V_{REF}$. Switch 231-1 is closed to connect the left terminal of capacitor $C_{N21}$ to $V_{GND}$, and switch 231-2 is closed to connect the left terminal of capacitor $C_{N22}$ to $V_{REF}$. In the equivalent circuit of FIG. 8, which, for convenience shows only the first two of capacitors $C_{N21}$, $C_{N22}$ . . . $C_{N2J}$, the charging of capacitor $C_{N1}$ and the first two of capacitors $C_{N21}$, $C_{N22}$ . . . $C_{N2J}$ (namely capacitors $C_{N21}$ and $C_{N22}$) is described by Equation 9, shown below:

$$Q_{NC1}=(V_{CNEG}-V_{REF})\times(C_{N1}+C_{N22})+(V_{CNEG}-V_{GND})\times C_{N21} \quad \text{(Eq. 9)}$$

The charging of capacitors $C_{N1}$, $C_{N21}$, $C_{N22}$ . . . $C_{N2J}$ is the same during both the sampling operation and conversion operation, so combining Equation 8 and Equation 9 and setting $V_{GND}$ equal to 0 results in Equation 10, shown below:

$$V_{CNEG} = V_{MID} + \frac{C_{N1}}{C_{N1}+C_{N21}+C_{N22}} \times (V_{REF}-V_{IN-}) + \frac{C_{N22}}{C_{N1}+C_{N21}+C_{N22}} \times V_{REF}. \quad \text{(Eq. 10)}$$

The capacitance of capacitor $C_{N1}$ is equal to the sum of the capacitances of capacitors $C_{N21}$, $C_{N22}$ . . . $C_{N2J}$, which is equal to C, so substituting this expression in Equation 10 results in Equation 11 shown below:

$$V_{CNEG} = V_{MID} + \frac{V_{REF}-V_{IN-}}{2} + \frac{C_{N22}}{C_{N1}+C_{N21}+C_{N22}} \times V_{REF}. \quad \text{(Eq. 11)}$$

It can be seen that the first three terms in Equation 11 constitute Equation 7. The remaining terms in Equation 11 represent the addition or subtraction of the offset component of the input signal $V_{IN-}$. Thus, the voltage $V_{CNEG}$ is a function of the input voltage $V_{IN-}$, and is offset by an amount which is a function of the constant reference voltage $V_{REF}$ and of the capacitance of the selectable combination of capacitors $C_{N1}$ and $C_{N21}$, $C_{N22}$ . . . $C_{N2J}$, that selectable combination being determined by the value of the offset compensation control signal DATA IN.

The above described operation of analog-to-digital converter 100 is for a differential input voltage $V_{IN}=V_{IN+}-V_{IN-}$. However, a single-ended input voltage referenced to ground can be applied to either of input terminals 10 or 20, with the other input terminal being connected to an internal fixed reference voltage, or preferably, an external fixed reference voltage, such as $V_{REF}$ or $V_{GND}$. In either case, the internal operation described above is equally applicable.

FIG. 10A shows a block diagram wherein the offset error compensation technique of the present invention is utilized to compensate a delta sigma ADC or a pipeline ADC designated by reference numeral 40. As in FIG. 1, the digital output signal DATA OUT is provided as an input to a control system 18, which generates an offset compensation signal DATA IN. The offset compensation signal DATA IN then controls the various switches of a pair of binarily weighted capacitors in each of a pair of offset compensation networks 4A and 4B. The input signal $V_{INE}$ applied to input conductor 10 is coupled by an input capacitor $C_{IN+}$ to a charge summing conductor 17 connected to the (+) of ADC 40. Conductor 17 also is connected to one terminal of each of the binarily weighted (or otherwise weighted) compensation capacitors of switched capacitor compensation circuit 4A and to one terminal of a feedback capacitor 41 A, the other terminal of which is connected to the serial DATA OUT conductor 2. Similarly, the input signal $V_{IN+}$ applied to input conductor 20 is coupled by an input capacitor $C_{IN-}$ to a charge summing conductor 27 connected to the (−) of ADC 40. Conductor 27 also is connected to one terminal of each of the binarily weighted (or otherwise weighted) compensation capacitors of a second switched capacitor compensation circuit 4B and to one terminal of a feedback capacitor 41B, the other terminal of which is connected to the serial DATA OUT conductor 2. FIG. 10B shows a variation of the embodiment of FIG. 10A in which the second switched capacitor compensation circuit 4B is omitted.

An important advantage of the invention is that the full-scale output of the ADC can represent a larger amplitude of an AC component of an analog input signal, so, in effect, the ADC resolution is increased compared to the situation wherein the offset component of the analog input signal is not automatically compensated. Another advantage of the invention is that it provides an ADC that is especially useful to compensate any sensor offset, especially in controlling motors. Also, the invention reduces the software overhead required by some prior art techniques for compensating an offset component of an input signal.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, the offset correction circuit 4 of FIG. 1 could be connected to a node similar to node 27 in a switched capacitor analog input signal sampling stage of another analog-to-digital converters than a SAR ADC, such as a delta sigma ADC or a pipeline ADC.

What is claimed is:

1. An analog-to-digital converter receiving an analog input signal including an offset component, the analog-to-digital converter comprising:
    (a) a switched capacitor input circuit configured to sample the analog input signal to produce and store a signal representative of the sampled input signal between a first conductor and a second conductor;
    (b) a conversion circuit coupled to the first conductor and the switched capacitor input circuit and configured to produce a digital output signal representative of the analog input signal;
    (c) an offset correction circuit having an output coupled to the second conductor and an input receiving a digital offset correction signal, the offset correction circuit including a switched capacitor correction circuit operative in response to the offset correction control signal to transfer charge to/from the second conductor;
    (d) the conversion circuit being operative in response to adjustment by the offset correction circuit of a signal conducted by the first conductor to produce the digital output signal compensated for the offset component.

2. The analog-to-digital converter of claim 1, wherein the analog-to-digital converter includes SAR (successive approximation register) analog-to-digital conversion circuitry.

3. The analog-to-digital converter of claim 1, wherein the analog-to-digital converter includes delta-sigma analog-to-digital conversion circuitry.

4. The analog-to-digital converter of claim 1, wherein the analog-to-digital converter includes pipeline analog-to-digital conversion circuitry.

5. The analog-to-digital converter of claim 2 wherein the analog input signal is a differential signal, and wherein the switched capacitor input circuit includes a first section including a first input terminal and a second section including a second input terminal, the differential input signal being applied between the first input terminal and the second input terminal.

6. The analog-to-digital converter of claim 2 wherein the analog input signal is a single-ended signal, and wherein the switched capacitor input circuit includes a first section including a first input terminal and a second section including a second input terminal, the second input terminal being connected to a constant reference voltage, the single-ended signal being applied to the first input terminal and the constant reference voltage being applied to the second input terminal.

7. The analog-to-digital converter of claim 2 wherein the analog input signal is a single-ended signal, and wherein the switched capacitor input circuit includes a first section including a first input terminal and a second section including a second input terminal, the first input terminal being connected to a constant reference voltage, the single-ended signal being applied to the second input terminal and the constant reference voltage being applied to the first input terminal.

8. The analog-to-digital converter of claim 5 wherein the first section includes a first switch coupled between the first input terminal and a first terminal of a first input capacitor and a second switch configured to selectively couple the first terminal of the first input capacitor to either a first reference voltage or a second reference voltage, a second terminal of the first input capacitor being coupled by a second conductor to a first input of a comparator.

9. The analog-to-digital converter of claim 8 wherein the second section includes a third switch coupled between the second input terminal and a first terminal of a second input capacitor and a fourth switch coupled between the first reference voltage and the first conductor, the first conductor being coupled to a second input of the comparator.

10. The analog-to-digital converter of claim 9 wherein the first section of the switched capacitor input stage includes a first group of binarily weighted capacitors each having a first terminal coupled to a corresponding switch, respectively, for selectively coupling the first terminal of that capacitor to either the first reference voltage or the second reference voltage, and a second terminal coupled to the second conductor.

11. The analog-to-digital converter of claim 9 wherein the offset correction circuit includes a second group of binarily weighted capacitors each having a first terminal coupled to a corresponding switch, respectively, for selectively coupling the first terminal of that capacitor to either the first reference voltage or the second reference voltage, and a second terminal coupled to the first conductor.

12. The analog-to-digital converter of claim 1 wherein the digital output signal is received by a control circuit which operates to measure and store peak values of the input signal and compute a magnitude and polarity of the offset component of the input signal, and produce a corresponding value of the offset correction control signal.

13. The analog-to-digital converter of claim 12 wherein the control circuit is an external control circuit which includes a data processing circuit.

14. The analog-to-digital converter of claim 13 wherein the data processing circuit includes a digital signal processor (DSP).

15. The analog-to-digital converter of claim 13 wherein the data processing circuit includes a microprocessor.

16. A method of avoiding loss of resolution in conversion of an analog input signal having an offset component to a digital signal, the method comprising:
    (a) determining a magnitude of the offset component;
    (b) producing an offset compensation control signal representative of the magnitude of the offset component; and
    (c) controlling a transfer of offset compensation charge into or out of a conductor in a switched capacitor input circuit of an analog-to-digital converter to adjust a signal representative of the analog input voltage being conducted by the first conductor so as to cause a conversion circuit of the analog-to-digital converter to produce a digital output signal having a full-scale value equal to the magnitude of the analog input signal plus or minus the magnitude of the offset component.

17. The method of claim 16 wherein step (a) includes determining the polarity of the offset component.

18. The method of claim 17 wherein step (a) includes measuring minimum and maximum peak values of the analog input signal by means of the analog-to-digital converter and using the peak values to compute a magnitude of the offset component and a polarity of the offset component and using the computed magnitude and polarity to produce the offset compensation signal.

19. The method of claim 17 wherein step (a) includes measuring a steady state value of the analog input signal to produce a value of the digital signal representative of the magnitude and polarity of the offset component.

20. The method of claim 17 wherein step (a) includes measuring a steady state value of the analog input signal to produce a value of the digital signal representative of the magnitude and polarity of the offset component if a transducer producing the analog input signal is controlled to produce a steady-state value which represents the offset component, and wherein step (a) includes measuring minimum and maximum peak values of the analog input signal by means of the analog-to-digital converter and using the peak values to compute a magnitude of the offset component and a polarity of the offset component and using the computed magnitude and polarity to produce the offset compensation signal if a transducer producing the analog input signal is not controlled to produce a steady-state value which represents the offset component.

21. An analog-to-digital conversion system for avoiding loss of resolution in conversion of an analog input signal having an offset component to a digital signal, comprising:
(a) means for determining a magnitude of the offset component;
(b) means for producing an offset compensation control signal representative of the magnitude of the offset component; and
(c) means for controlling a transfer of offset compensation charge into or out of a conductor in a switched capacitor input circuit of an analog-to-digital converter to adjust a signal representative of the analog input voltage being conducted by the first conductor so as to cause a conversion circuit of the analog-to-digital converter to produce a digital output signal having a full-scale value equal to the magnitude of the analog input signal plus or minus the magnitude of the offset component.

22. The analog-to-digital conversion system of claim 21 wherein the means for determining a magnitude of the offset component also determines the polarity of the offset component.

23. The analog-to-digital conversion system of claim 21 wherein the means for producing an offset compensation control signal includes means for measuring minimum and maximum peak values of the analog input signal by means of the analog-to-digital converter and using the peak values to compute a magnitude of the offset component and a polarity of the offset component and using the computed magnitude and polarity to produce the offset compensation signal.

24. The analog-to-digital conversion system of claim 22 wherein the means for determining a magnitude and polarity of the offset component includes means for measuring a steady state value of the analog input signal to produce a value of the digital signal representative of the magnitude and polarity of the offset component.

25. The analog-to-digital conversion system of claim 22 wherein the means for determining a magnitude and polarity of the offset component includes means for measuring a steady state value of the analog input signal to produce a value of the digital signal representative of the magnitude and polarity of the offset component if a transducer producing the analog input signal is controlled to produce a steady-state value which represents the offset component, and means for measuring minimum and maximum peak values of the analog input signal by means of the analog-to-digital converter and using the peak values to compute a magnitude of the offset component and a polarity of the offset component and using the computed magnitude and polarity to produce the offset compensation signal if a transducer producing the analog input signal is not controlled to produce a steady-state value which represents the offset component.

* * * * *